(12) United States Patent
Furukawa et al.

(10) Patent No.: US 8,228,960 B2
(45) Date of Patent: Jul. 24, 2012

(54) LASER DEVICE, LASER DISPLAY DEVICE, AND LASER IRRADIATION DEVICE

(75) Inventors: Akio Furukawa, Tokyo (JP); Kaoru Kimura, Tokyo (JP)

(73) Assignee: Sony Corporation, Tokyo (JP)

( * ) Notice: Subject to any disclaimer, the term of this patent is extended or adjusted under 35 U.S.C. 154(b) by 92 days.

(21) Appl. No.: 12/379,903

(22) Filed: Mar. 4, 2009

(65) Prior Publication Data

US 2009/0257462 A1   Oct. 15, 2009

(30) Foreign Application Priority Data

Apr. 14, 2008   (JP) ................................ 2008-104916

(51) Int. Cl.
*H01S 3/10* (2006.01)
(52) U.S. Cl. .............................. 372/22; 372/21; 372/23
(58) Field of Classification Search .................... 372/22, 372/21, 23
See application file for complete search history.

(56) References Cited

U.S. PATENT DOCUMENTS

| | | | |
|---|---|---|---|
| 5,185,752 A * | 2/1993 | Welch et al. ..................... 372/22 |
| 5,953,359 A * | 9/1999 | Yamaguchi et al. ........ 372/50.12 |
| 6,259,711 B1 * | 7/2001 | Laurell ........................... 372/22 |
| 7,330,490 B2 * | 2/2008 | Furukawa et al. .............. 372/21 |
| 2007/0133638 A1 * | 6/2007 | Mizuuchi et al. .......... 372/50.11 |

FOREIGN PATENT DOCUMENTS

| | | |
|---|---|---|
| JP | 2003-295243 A | 10/2003 |
| JP | 2006-189587 A | 7/2006 |
| JP | 2007-214300 A | 8/2007 |
| JP | 2008-004743 A | 1/2008 |
| JP | 2009-253007 A | 10/2009 |

OTHER PUBLICATIONS

Japanese Office Action issued Feb. 18, 2010 for corresponding Japanese Application No. 2008-104916.

* cited by examiner

*Primary Examiner* — Kinam Park
(74) *Attorney, Agent, or Firm* — Rader Fishman & Grauer, PLLC

(57) ABSTRACT

The present invention provides a laser device having a high wavelength conversion efficiency and a wide wavelength width, and is suitable as a display light source. The laser device includes a fundamental wave generating section including a laser diode which has a plurality of luminous points and a bragg reflection structure, and generating a plurality of fundamental waves which has at least a pair of wavelengths different from each other, and a nonlinear optical element having a periodic polarization inversion structure, and generating harmonics corresponding to the plurality of fundamental waves, respectively.

20 Claims, 7 Drawing Sheets

WAVELENGTHS OF SECOND HARMONICS

→ AXIS DIRECTION

VERTICAL DIRECTION ↑

WAVELENGTHS OF SECOND HARMONICS

LASER DEVICE, LASER DISPLAY DEVICE, AND LASER IRRADIATION DEVICE

BACKGROUND OF THE INVENTION

1. Field of the Invention

The present invention relates to a laser device having an array structure with a plurality of luminous points, and a laser display device and a laser irradiation device using the laser device.

2. Description of the Related Art

A laser diode has features that emitted light is superior in monochromaticity, and the laser diode has a compact size and lightweight in comparison with other light sources. Thus, the laser diode is suitably utilized as a light source of a projection display or the like. However, when laser light is irradiated to an irradiated plane, a speckle pattern called speckle noise appears and a screen flickers. This is a special phenomenon caused by that the laser light has a single-wavelength and phases are aligned so that coherence is remarkably high.

To reduce such speckle noise, there are methods using an external optical element, such as a method where the laser diode is driven with high-frequency waves, a method where a diffusion plate or a diffusion sheet is vibrated, and a method where the laser light once passes through fibers having different lengths to reduce the coherence. Moreover, to reduce speckle noise, there is another method where an oscillation wavelength width of a semiconductor laser array is widened to several nm by using a phenomenon that, when the laser diode emits light, heat is generated inside the laser diode and the oscillation wavelength changes (Japanese Unexamined Patent Publication Nos. 2007-214300 and 2008-4743). Among them, the method of widening the wavelength width of the semiconductor laser array is advantageous since increasing a number of members and large-scale drive circuits are unnecessary so that reduction of speckle noise with inexpensive device configuration is possible.

In this type of laser diode, for light having a green wavelength region of the primary colors red (R), blue (B), and green (G), material system which directly oscillates with practical efficiency and reliability has been undeveloped at this point. Thus, to obtain light having the green wavelength region, there is considered a following method using wavelength conversion.

In the method using the wavelength conversion, light in an infrared region (wavelength of 1060 nm) from laser is output as fundamental waves, and the fundamental waves enter into a nonlinear optical element formed with lithium niobate (LiNb03) or lithium tantalite (LiTa03). The fundamental waves are wavelength-converted to second harmonics by the nonlinear optical element, and become green laser light with a wavelength of 530 nm. As a light source, a laser diode or a diode pumped solid state laser (DPSSL) is used.

SUMMARY OF THE INVENTION

In this way, it is possible to obtain green laser light by the method using the wavelength conversion, however, there are issues to use the green laser light for display light sources as will be described below.

That is, to obtain the second harmonics (green light) with practical conversion efficiency by using the nonlinear optical element, it is necessary that phases of the fundamental waves traveling through crystal and the second harmonics are quasi-matched (quasi-phase matched) by a structure where a direction of polarization of the crystal constituting the nonlinear optical element is periodically inversed (periodic polarization inversion structure). However, in the nonlinear optical element which has been hitherto used, the direction of polarization of the crystal is inversed in a predetermined period, and the period in polarization inversion is unchanged along the width direction. Moreover, because the wavelength width of the fundamental waves satisfying quasi-phase matching conditions is small as 0.1 nm, it is difficult to widen the wavelength width to several nm, which is considered necessary to reduce the speckle noise. For these reasons, in the green wavelength of the related art, it is difficult to manufacture a laser device having a high wavelength conversion efficiency and a wide wavelength width, and usable as a highly practical display light source.

In the view of the foregoing, it is desirable to provide a laser device having a high wavelength conversion efficiency and a wide wavelength width, and suitable as a display light source or the like.

It is further desirable to provide a laser display device and a laser irradiation device using the laser device as a light source.

According to an embodiment of the present invention, there is provided a laser device including a fundamental wave generating section including a laser diode which has a plurality of luminous points and a bragg reflection structure, and generating a plurality of fundamental waves which have at least a pair of wavelengths different from each other; and a nonlinear optical element having a periodic polarization inversion structure, and generating harmonics corresponding to the plurality of fundamental waves, respectively. More specifically, the plurality of luminous points in the laser diode are linearly arranged, and the bragg reflection structure has a periodic structure where reflection wavelengths change along an arrangement direction of the luminous points. Here, the expression "reflection wavelengths change along an arrangement direction" is not limited to the case where the reflection wavelengths change (increase or decrease) step by step along the arrangement direction of the plurality of luminous points. It is acceptable as long as the reflection wavelengths are different in incident positions of at least two fundamental waves.

In the laser device according to an embodiment of the present invention, the plurality of lights generated in the luminous points of the laser diode are resonated between the laser diode and the bragg reflection structure, and stabilized in a small wavelength width desired in the nonlinear optical element to be output as the plurality of fundamental waves having wavelengths different from one another. The fundamental waves are wavelength-converted to harmonics in the nonlinear optical element, and laser light having a desired wavelength and a wide wavelength width are output.

According to an embodiment of the present invention, there are provided a laser display device and a laser irradiation device each including the laser device as a light source.

In the laser device according to an embodiment of the present invention, the plurality of lights are resonated between the laser diode and the bragg reflection structure and stabilized, and the fundamental waves have wavelengths different from one another and are wavelength-converted in the nonlinear optical element. Thereby, the laser light having the desired wavelength and the wide wavelength width are output. Speckle noise may be suppressed in the laser display device using the laser device according to an embodiment of the present invention.

In the laser irradiation device according to an embodiment of the present invention, uniform and accurate irradiation may be performed by using the laser device.

Other and further objects, features and advantages of the invention will appear more fully from the following description.

DETAILED DESCRIPTION OF THE PREFERRED EMBODIMENTS

Preferred embodiments of the present invention will be described in detail with reference to the accompanying drawings.

First Embodiment

Figure 1:
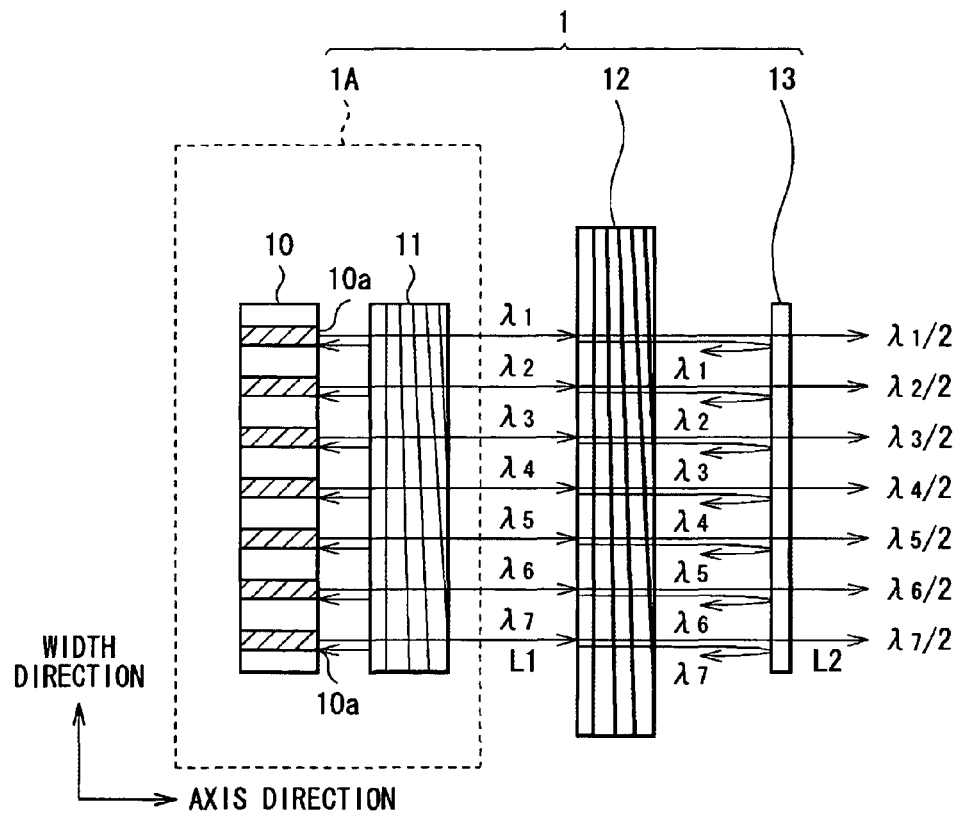
FIG. 1 is a configuration view of a laser device according to a first embodiment of the present invention.

FIG. 1 illustrates the configuration of a laser device 1 according to a first embodiment of the present invention. The laser device 1 includes a laser diode 10 having an array structure with a plurality of luminous points 10a, a bragg reflector 11, a nonlinear optical element 12, and a filter 13 arranged in this order. Hereinafter, a longitudinal direction of the laser diode 10 (arrangement direction of the plurality of luminous points 10a) is referred to as a width direction, and a direction orthogonal to the width direction (arrangement direction of the components) is referred to as an axis direction. The bragg reflector 11, the nonlinear optical element 12, and the filter 13 are arranged in parallel along the longitudinal direction of the laser diode 10, respectively.

In the first embodiment, the laser diode 10 and the bragg reflector 11 constitute a fundamental wave generating section 1A. The fundamental wave generating section 1A generates a plurality of (here, for example, seven) fundamental waves L1 having wavelengths different from one another (wavelengths $\lambda 1$ to $\lambda 7$). The laser diode 10 includes, for example, a strained InGaAs active layer with an oscillation wavelength of 1060 nm, and each of the seven luminous points 10a outputs a laser light with a wavelength of 1060 nm.

The bragg reflector 11 is a grating having an EG (external grating) structure configured separately from the laser diode 10, and is composed of, for example, a VBG (volume bragg grating). The bragg reflector 11 has strong reflection characteristics to a specific wavelength (wavelength in the 1060 nm wavelength of light emitted from the laser diode 10) by repeatedly arranging material with low-refractive index and material with high-refractive index.

The bragg reflector 11 is formed with, for example, glass material. The bragg reflector 11 is formed by generating interference inside a glass plate with ultraviolet laser light irradiated to the glass plate, allowing periodical change in refractive index by the photorefractive effect in which the refractive index is permanently changed in a region with strong light intensity, and forming a grating pattern. In the bragg reflector 11 of the first embodiment, a period of the grating changes (increases or decreases) step by step along the width direction, that is, along the arrangement direction of the plurality of luminous points 10a in the laser diode 10, and the reflection wavelengths also change step by step within the above-described specific wavelength.

The bragg reflector 11 and the laser diode 10 constitute a resonator. That is, the bragg reflector 11 bragg-reflects light having a specific wavelength and returns the light to each of the luminous points 10a, and the reflected light is resonated between the laser diode 10 and the bragg reflector 11 to be locked. This results in that the oscillation wavelength from each of the luminous points 10a is stabilized within a narrow wavelength width of approximately 0.1 nm. A part of the light having the stabilized wavelength is output as a fundamental wave L1 from the bragg reflector 11.

In this way, at a previous stage of the nonlinear optical element 12, each of the wavelengths of the fundamental waves L is stabilized with the bragg reflector 11 due to the following reasons. The oscillation wavelength width of the light inside the laser diode 10 is wide as approximately 3 nm and the wavelength width of the light in the luminous points 10a is wide as approximately 1 nm. Thus, even if the light emitted from each of the luminous points 10a in the laser diode 10 directly enters into the nonlinear optical element 12, the quasi-phase matching conditions in the periodic polarization inversion in the nonlinear optical element 12 are not fully satisfied as will be described later. Given this situation, in the first embodiment, the bragg reflector 11 is arranged between the nonlinear optical element 12 and the laser diode 10 so that the emitted light (fundamental waves) is stabilized within the narrow wavelength width of approximately 0.1 mm as described above. Because the reflection wavelengths change step by step along the width direction in the bragg reflector 11 as described above, the wavelengths of the light locked between the laser diode 10 and the bragg reflector 11 also change along the width direction. Thereby, each of the wavelengths $\lambda 1$ to $\lambda 7$ of the plurality of fundamental waves L1 output from the bragg reflector 11 also changes (increases or decreases) step by step along the width direction.

In the case where the laser device 1 is used as a light source of the laser display device, the difference between the shortest wavelength and the longest wavelength (wavelength width) in the fundamental waves L1 is preferably large to reduce more speckle noise. However, in consideration of reduction in color reproducibility and reduction in photoelectric conversion efficiency caused by a gain-bandwidth of the laser diode 10, it is preferable to set the difference from 4 nm to 6 nm.

In the arrangement, the nonlinear optical element 12 faces the bragg reflector 11. The nonlinear optical element 12 has a periodic polarization inversion structure, and generates second harmonics L2 (wavelength $\lambda 1/2$ to $\lambda 7/2$) corresponding to the fundamental waves L1 (wavelengths $\lambda 1$ to $\lambda 7$) emitted from the bragg reflector 11, respectively. Specifically, the nonlinear optical element 12 is formed with, for example, $LiTaO_3$ or $LiNbO_3$. When a predetermined voltage is applied to the nonlinear optical element 12, the periodic polarization inversion is generated, and the period changes along the width direction, for example in the case of $LiTaO_3$, within the range from 7.918 mm to 8.010 mm.

In the nonlinear optical element 12, it is necessary that the fundamental waves L1 and the second harmonics L2 are quasi-phase matched in the positions in the width direction according to the wavelength difference of the entering fundamental waves L1. This is because, to obtain a practical efficiency for wavelength conversion from the fundamental waves L1 to the second harmonics L2, it is necessary to quasi-match (to quasi-phase match) the phases of the fundamental waves L1 traveling through crystal and the second harmonics L2 by using the structure where a direction of polarization of crystal constituting the nonlinear optical element 12 is periodically inversed (periodic polarization inversion structure). Thus, in the nonlinear optical element 12, the period in polarization inversion of crystal constituting the nonlinear optical element 12 changes along the width direction, and the change amount of the period in polarization inversion satisfies the quasi-phase matching conditions in the position where each of the plurality of fundamental waves L1 (wavelengths $\lambda 1$ to $\lambda 7$) enters. Thereby, in the nonlinear optical element 12, the wavelength conversion efficiency from the fundamental waves to the second harmonics becomes high, and light with the wavelengths from $\lambda 1/2$ to $\lambda 7/2$ is generated as the second harmonics.

The length in the width direction of the nonlinear optical element 12 (the length in the direction where the period in polarization inversion changes) is set longer than the length of the laser diode 10 (distance between both ends of the plurality of luminous points 10a) for positional adjustment. The positional adjustment will be described later.

Figure 2:
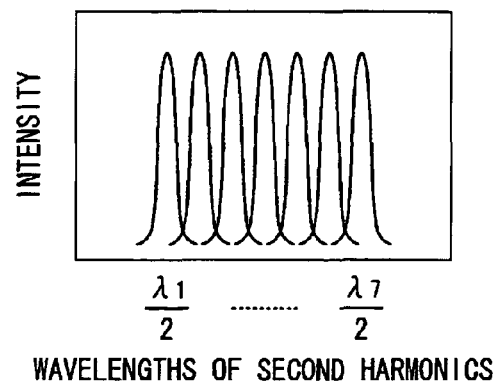
FIG. 2 is a view for explaining wavelength width of second harmonics output from the laser device of FIG. 1.

The filter 13 blocks the fundamental waves L1 of the light output from the nonlinear optical element 12, and transmits only the second harmonics L2. When the second harmonics L2 transmitting the filter 13 are condensed, the wavelength width of the synthesized wave becomes wide as shown in FIG. 2. For example, as described above, when the wavelength width of the fundamental waves L1 is set from 4 nm to 6 nm, the wavelength width of the synthesized wave becomes 2 nm to 3 nm.

In the laser device 1 having such a configuration in the first embodiment, the light generated in each of the luminous points 10a in the laser diode 10 becomes the fundamental waves L1 having the stabilized wavelength width and the wavelengths different from one another, by using a resonator structure between the laser diode 10 and the bragg reflector 11 in which the periodic structure changes step by step (that is, the reflection characteristics change step by step).

The fundamental waves L1 having the wavelengths different from one another are partially wavelength-converted in the nonlinear optical element 12 satisfying the quasi-phase matching conditions. As a result, the fundamental waves L1 and the second harmonics L2 with the wavelengths from $\lambda 1/2$ to $\lambda 7/2$ are output from the nonlinear optical element 12. Between them, only the second harmonics L2 transmits the filter 13, and become green laser light with a wavelength of 530 nm.

In this way, in the first embodiment, the wavelength-conversion is performed by using the nonlinear optical element 12, and the bragg reflector 11 is provided between the nonlinear optical element 12 and the laser diode 10 so that the light is resonated and stabilized in the narrow wavelength width. Thus, the fundamental waves L1 entering into the nonlinear optical element 12 satisfy the quasi-phase matching conditions of the period in polarization inversion. In the nonlinear optical element 12, the periodic polarization inversion structure changes step by step in accordance with each of the wavelengths ($\lambda 1$ to $\lambda 7$) of the fundamental waves L1 along the width direction. Thus, the quasi-phase matching conditions are satisfied in each position individually where the plurality of fundamental waves L1 enter. Thereby, the plurality of second harmonics L2 having wavelengths different from one another are generated. Therefore, in the synthesized light of the second harmonics L2, the wavelength width (difference between the longest wavelength and the shortest wavelength) becomes wide. Accordingly, in the laser display device using the laser device 1 as a light source, generation of speckles noise is suppressed.

In particular, in the first embodiment, the wavelengths of the fundamental waves are set in an infrared region, and the nonlinear optical element 12 has the polarization inversion period satisfying the quasi-phase matching conditions between the wavelengths of the fundamental waves and the wavelengths of the second harmonics, and thus the light having the green wavelength region and the high conversion efficiency may be obtained.

Figure 9:
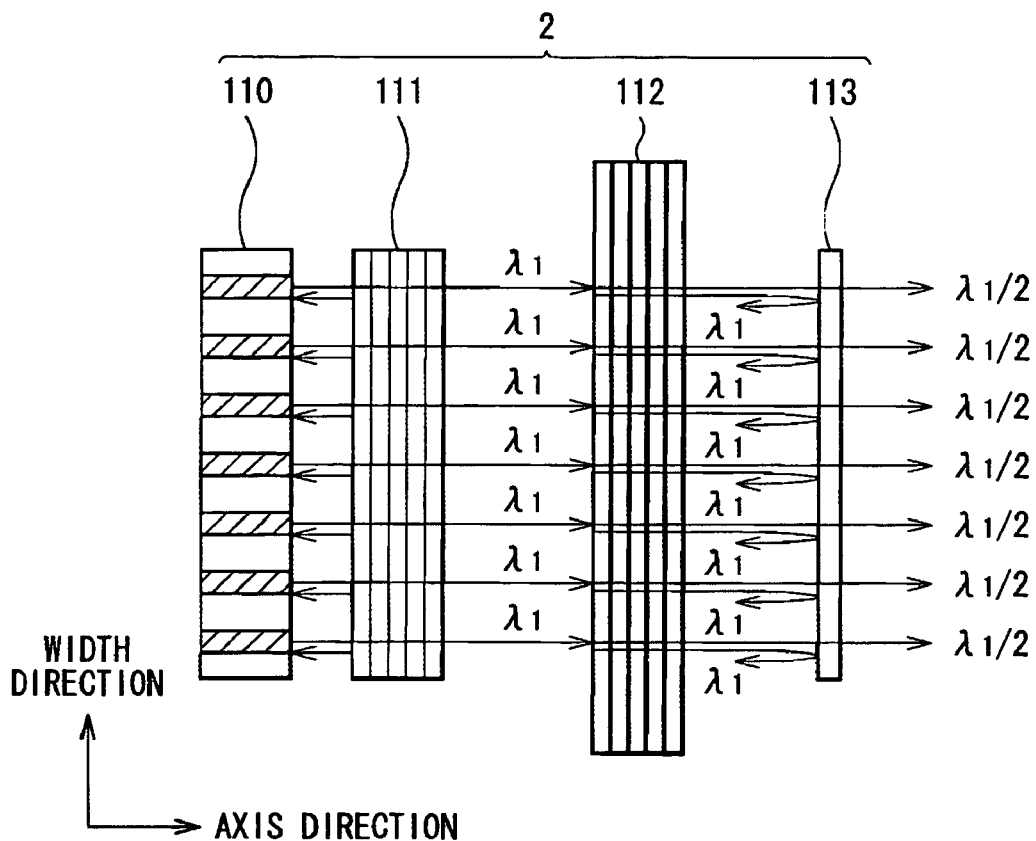
FIG. 9 is a view illustrating the configuration of a laser device using a bragg reflector and a nonlinear optical element of the related art.

In the related art, the wavelengths of the fundamental waves and the polarization inversion period in the nonlinear optical element are set constant. FIG. 9 illustrates the configuration of such a laser device 2. Although the laser device 2 also includes a laser diode 110, a bragg reflector 111, a nonlinear optical element 112, and a filter 113, the laser device 2 differs from the above-described laser device 1 in that the periodic structure of the bragg reflector 111 and the periodic polarization inversion structure of the nonlinear optical element 112 are constant along the width direction.

Figure 10:
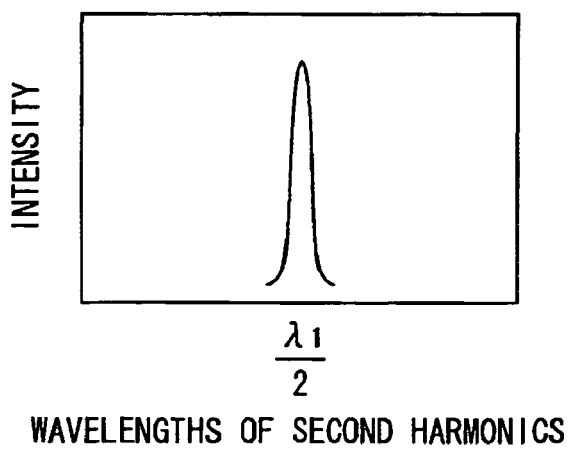
FIG. 10 is a view for explaining second harmonics output from the laser device of FIG. 9.

In the laser device 2 having such a configuration, the wavelengths of the light bragg-reflected on the bragg reflector 111 are all the same. Thus, even if the light is resonated between the laser diode 110 and the bragg reflector 111 and a part of the light is output from the bragg reflector 111, the wavelengths $\lambda 1$ of the fundamental waves become the same. The nonlinear optical element 112 has a constant periodic polarization inversion structure, and satisfies the quasi-phase matching conditions to each of the fundamental waves. As a result, the second harmonics having wavelengths of $\lambda 1/2$ are obtained. When the wavelengths $\lambda$ of the fundamental waves are 1060 nm, the wavelengths of the second harmonics are 530 nm. Accordingly, the synthesized wave of the second harmonics transmitting the filter 113 also has a peak as shown in FIG. 10, and the wavelength width is also narrowed to 0.1 nm. Therefore, when the laser device 2 is used as a light source of the laser display device, strong speckle noise is generated as described before.

Between the oscillation wavelength of the laser diode 10 (wavelength of the fundamental wave) and the quasi-phase matching conditions in the nonlinear optical element 12, it is necessary that the wavelength width is arranged within a narrow range as approximately 0.1 nm, and, at the same time, the center wavelength is arranged within precision of less than the wavelength width.

In general, the quasi-phase matching conditions of the center wavelength of the fundamental waves and the periodic polarization inversion in the nonlinear optical element are varied depending on manufacture error. In such a case, in the laser device 2 having a configuration of the related art as described above, it is possible that the wavelengths of the fundamental waves and the wavelengths satisfying the quasi-phase matching conditions in the nonlinear optical element 112 are matched by controlling the temperature of the nonlinear optical element 112 and slightly adjusting incident angles of the fundamental waves.

On the other hand, in the first embodiment, the wavelengths of the plurality of fundamental waves L entering into the nonlinear optical element 12 are different from one another, and thus it is necessary that the quasi-phase matching conditions are satisfied for each of the fundamental waves individually. For this reason, the adjustment means with higher flexibility is necessary.

In the first embodiment, the length in the width direction of the nonlinear optical element 12 is longer than that of the laser diode 10, and the change ratio of the wavelength of the fundamental wave along the width direction and the change ratio of the wavelength satisfying the quasi-phase matching conditions along the width direction are corresponding. In addition, it is unnecessary that these change ratios are perfectly corresponding, as long as the difference between the change ratios is within the range with no practical issues.

In this case, the range where the nonlinear optical element 12 satisfies the quasi-phase matching conditions becomes larger than the range of the oscillation wavelength of the laser diode 10 (wavelength of fundamental wave). Even in the case where a shift is generated due to manufacture error in the positional relationship where the center wavelengths are corresponding, it is possible to correct and adjust the position by shifting, in the width direction, the relative position of the nonlinear optical element 12 to the laser diode 10, while monitoring the conversion efficiency from the fundamental waves to the second harmonics. This point will be specifically described in the following.

Figure 3:
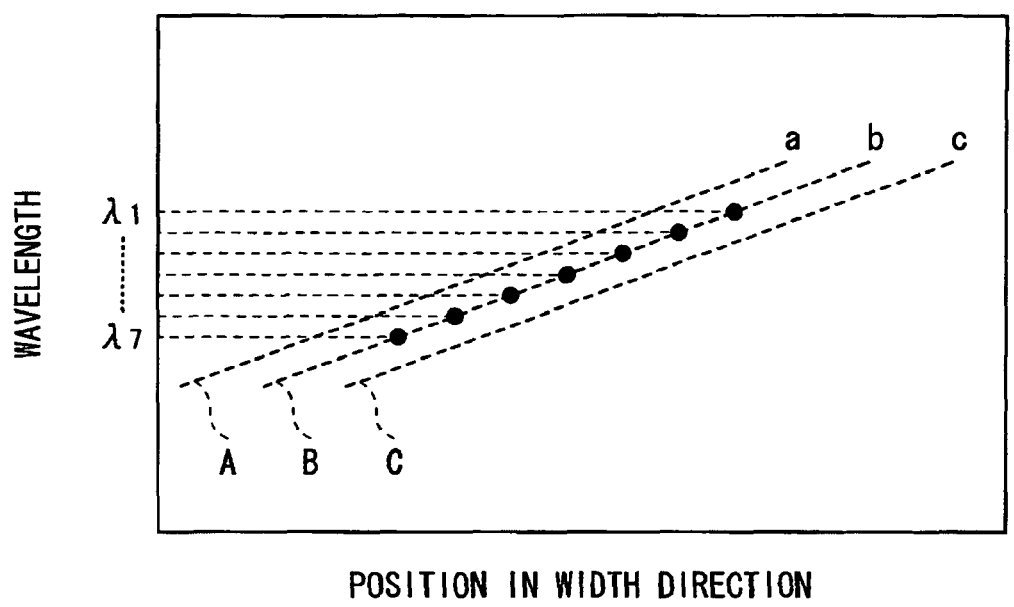
FIG. 3 is a view for explaining relationship between a relative position of a nonlinear optical element to the laser diode, and wavelengths of fundamental waves.

FIG. 3 illustrates relationship between the wavelengths of the fundamental waves and the relative position of the nonlinear optical element 12 to the laser diode 10. Here, the horizontal axis shows the relative position of the nonlinear optical element 12 to the laser diode 10 in the width direction, and the vertical axis shows the wavelengths of the fundamental waves, respectively.

Figure 4:
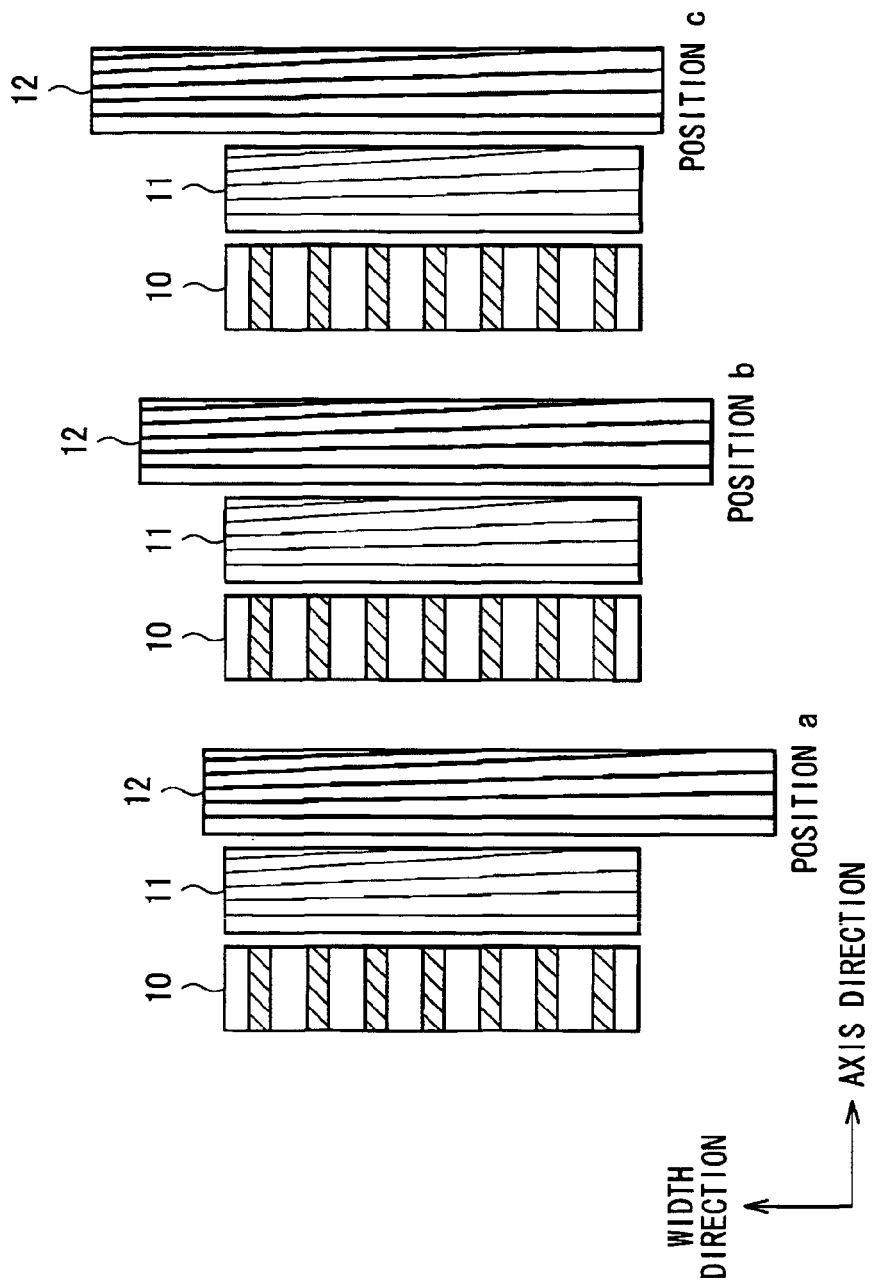
FIGS. 4A, 4B and 4C are views illustrating a positional relationship between the laser diode and a bragg reflector, and the nonlinear optical element.

Here, it is regarded that the wavelengths $\lambda 1$ to $\lambda 7$ of the fundamental waves as the wavelengths stabilized by the laser diode 10 and the bragg reflector 11 have the distributions as indicated by circles to the positions in the width direction, respectively. The wavelengths satisfying the quasi-phase matching conditions in the nonlinear optical element 12 have relationship of dotted lines A to C with respect to relative positions "a" to "c" of the nonlinear optical element 12 to the laser diodes 10 shown in FIGS. 4A to 4C, respectively. In this case, when the nonlinear optical element 12 is located in the relative position "b", the wavelengths of the plurality of fundamental waves simultaneously correspond to the quasi-phase matching conditions. That is, when the nonlinear optical element 12 is located in the relative position "a" or "c" (as in FIGS. 4A and 4C), the position of the nonlinear optical element 12 is shifted in the width direction and adjusted to the relative position "b". Thereby, it is possible that the wavelengths of the plurality of fundamental waves simultaneously correspond to the quasi-phase matching conditions.

In the case where the change ratio of the wavelengths of the fundamental waves and the change ratio of the wavelengths satisfying the quasi-phase matching conditions are shifted due to manufacture error or the like, even if the position of the nonlinear optical element 12 is adjusted in the width direction as described above, the quasi-phase matching conditions are not simultaneously satisfied in all the positions where the fundamental waves enter. In this case, the temperature of at least one of the bragg reflector 11 and the nonlinear optical element 12 may be adjusted. Alternatively, at least one of the bragg reflector 11 and the nonlinear optical element 12 may be rotated about the alignment direction (axis direction) of these components as the rotation axis and adjusted. Thereby, the quasi-phase matching conditions are satisfied in the nonlinear optical element 12.

In the first embodiment, although the bragg reflector 11 constituting the fundamental wave generating section 1A is described as the volume bragg grating having the EG structure, the bragg reflector may be formed inside the laser structure. Hereinafter, such examples will be described as a second embodiment and a third embodiment. The configurations of the nonlinear optical element 12 and the filter 13 are the same as in the first embodiment, thereby the descriptions are omitted.

Second Embodiment

In the second embodiment, a DBR (distributed bragg reflector) laser having a DBR structure which includes a bragg reflector in a region except a light emitting region of a DBR laser 20 is used as a fundamental wave generating section 1A.

Figure 5:
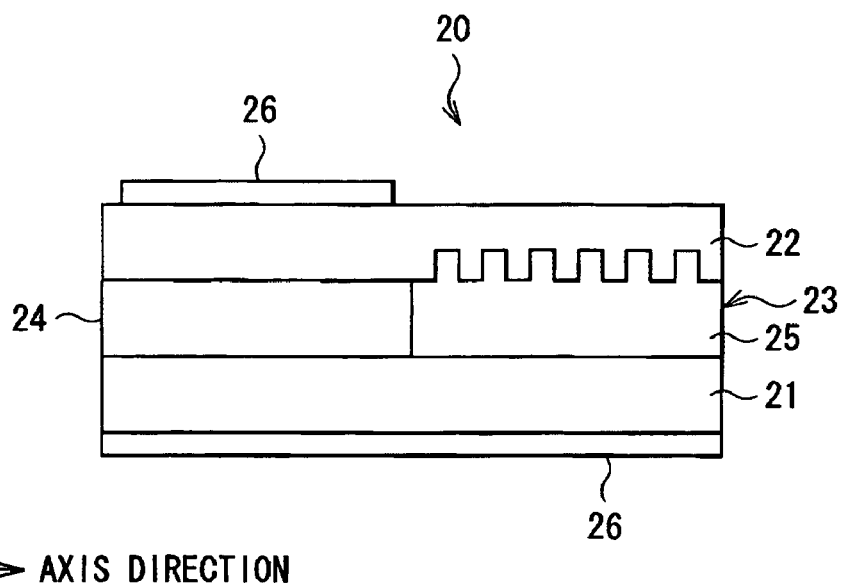
FIG. 5 is a cross-sectional view illustrating structure of a DBR laser according to a second embodiment of the present invention.

FIG. 5 roughly illustrates a cross-sectional structure of the DBR laser 20. The DBR laser 20 includes a light waveguide 23 between a p-type cladding layer 21 of a p-type semiconductor and an n-type cladding layer 22 of an n-type semiconductor. Moreover, electrodes 26 are formed on surfaces of the cladding layers 21 and 22, respectively. In the light waveguide 23, an active layer 24 and a distributed reflector layer 25 as a bragg reflector are arranged in an axis direction. The distributed reflector layer 25 is formed in the following way. A photoresist film is applied on a semiconductor layer, and interference patterns are irradiated with ultraviolet laser so that the photoresist is exposed and developed. Thereby, a mask with grating patterns is formed on the semiconductor layer, and the semiconductor layer is etched.

In the DBR laser 20 including the distributed reflector layer 25, the light generated in the active layer 24 is transmitted through the light waveguide 23 in the axis direction, and the bragg reflection is generated by the distributed reflector layer 25 at this time. That is, the fundamental waves having the bragg wavelengths are emitted from the DBR laser 20. Thus, when the grating patterns of the distributed reflector layer 25 in the light waveguide 23 are adjusted for each luminous point, the plurality of fundamental waves having wavelengths different from one another are obtained.

Third Embodiment

In the third embodiment, a DFB (distributed feed back) laser having a DFB structure which includes a bragg reflector in a light emitting region is used as a fundamental wave generating section 1A.

Figure 6:
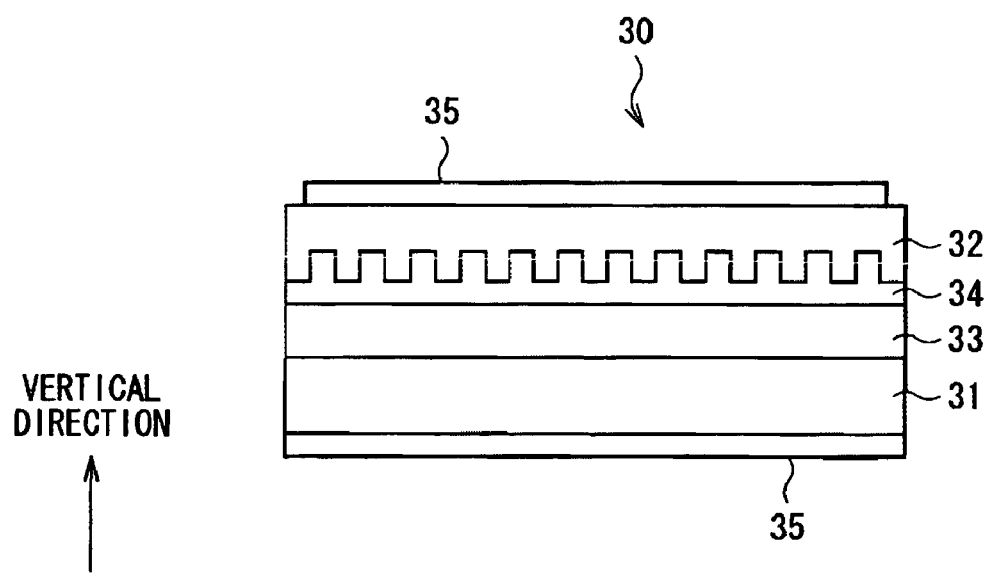
FIG. 6 is a cross-sectional view illustrating structure of a DFB laser according to a third embodiment of the present invention.

FIG. 6 roughly illustrates a cross-sectional structure of a DFB laser 30. The DFB laser 30 includes an active layer 33 and a grating layer 34 as the bragg reflector between a p-type cladding layer 31 of a p-type semiconductor and an n-type cladding layer 32 of an n-type semiconductor. The active layer 33 and the grating layer 34 are provided adjacent to each other in a vertical direction (in a direction perpendicular to both of the width direction and the axis direction). Moreover, electrodes 35 are formed on surfaces of the cladding layers 31 and 32, respectively. In addition, the grating layer 34 may be manufactured in the substantially same way as the distributed reflector layer 25 of the DBR laser 20 in the second embodiment.

In the DFB laser 30, a concavo-convex grating (grating layer 34) is arranged on the active layer 33. Thereby, the grating is oscillated with the bragg wavelength exhibiting the strongest reflection, and emitted as the fundamental waves. Accordingly, when the grating pattern of the grating layer 34 is adjusted for each luminous point, the plurality of fundamental waves having wavelengths different from one another are obtained.

Other configurations and operational effects of the second and the third embodiments are the same as those of the first embodiment.

SPECIFIC EXAMPLE

Hereinafter, a specific example will be described.

A laser diode 10 includes a strained InGaAs active layer with an oscillation wavelength of 1060 nm, and has nineteen luminous points 10a each having a width of 0.15 nm located at intervals of 0.5 mm in a width of 10 mm. A bragg reflector 11 strongly reflects a specific wavelength in a wavelength of 1060 nm, and a reflection wavelength changes step by step along a width direction (arrangement direction of the luminous points 10a). As a result, the oscillation wavelength in the nineteen luminous points 10a becomes wavelengths different from one another over the wavelength range from 1057 nm to 1063 nm, and each light is locked within a narrow wavelength width of 0.1 nm so that the wavelength is stabilized. The laser light with the stabilized wavelengths enters into the nonlinear optical element 12 having a width of 15 mm of $LiTaO_3$. In the nonlinear optical element 12, when a voltage is applied, the periodic polarization inversion is generated, and the period changes along the width direction within a range from 7.918 μm to 8.010 μm. As a result, a green laser light is generated as second harmonics with wavelengths from 528.5 nm to 531.5 nm (wavelength width). These second harmonics transmit the filter 13, however, the fundamental waves (wavelength from 1057 nm to 1063 nm) are blocked. The synthesized wave of the light transmitting the filter 13 has a wavelength width of 3 nm.

In the nonlinear optical element 12, because the quasi-phase matching conditions are satisfied in each of the positions where the plurality of fundamental waves enter, it is possible that the second harmonics are generated with a high conversion ratio of 2%/W/cm.

Hereinafter, an application example of a laser device 1 will be described.

Figure 7:
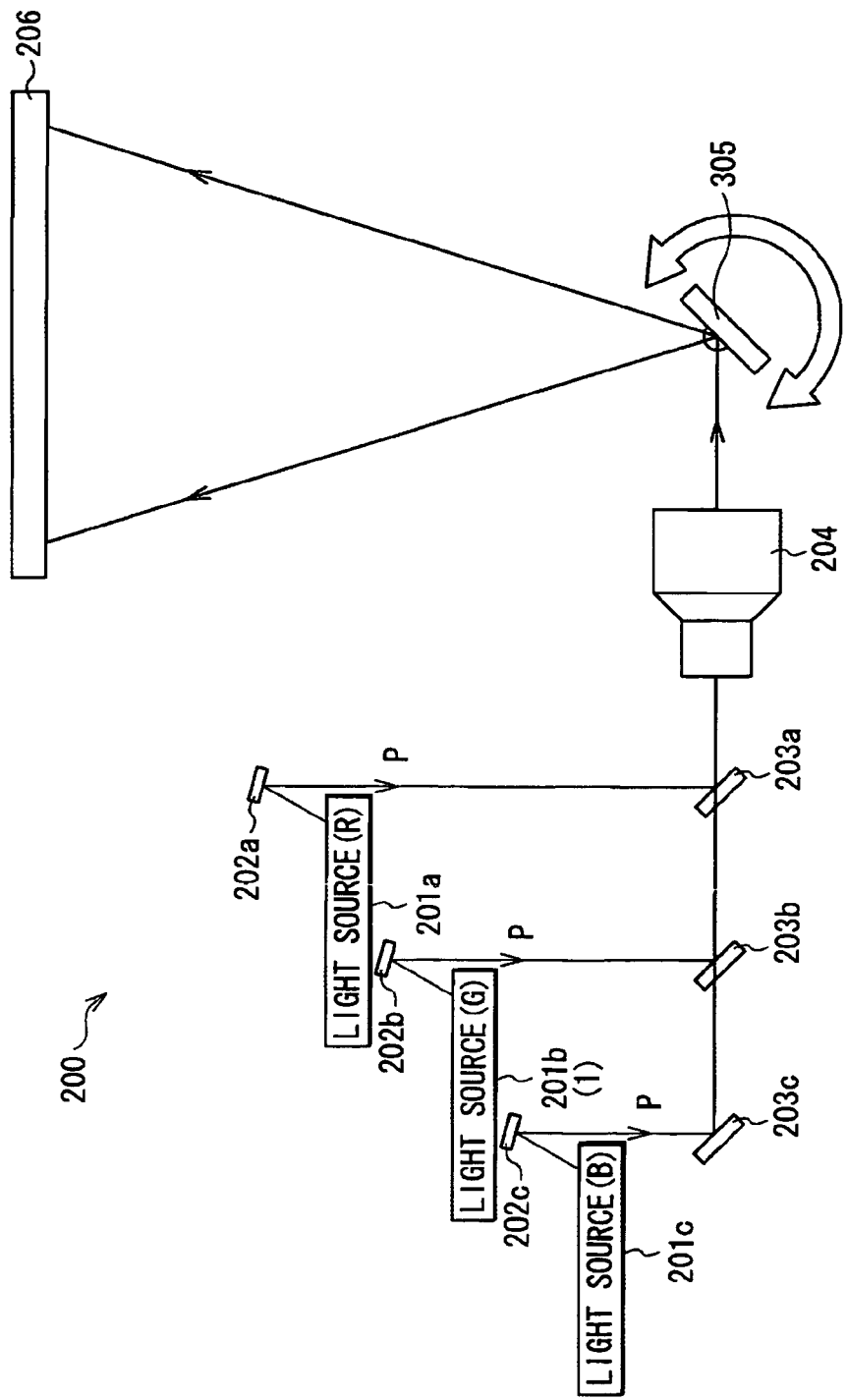
FIG. 7 is a configuration view of a laser display device.

FIG. 7 illustrates the application example of the laser device 1 applied to a laser display device 200. The laser display device 200 includes light sources 201a, 201b, and 201c emitting red (R), green (G), and blue (B) light, respectively, and the above-described laser device 1 is disposed as the light source 201b emitting the green light. Moreover, the laser display device 200 includes light switching element arrays 202a, 202b, and 202c provided corresponding to the light sources 201a, 201b, and 201c, respectively, dichroic mirrors 203a, 203b, and 203c, a projection lens 204, a galvano-mirror 205 as a single-axis scanner, and a projection screen 206. In addition, the three primary colors of red, green, and blue may be substituted with cyan, magenta, and yellow. The switching element arrays 202a, 202b, and 202c are a plurality of switching elements (a number of switching elements necessary for a number of pixels) arranged in a direction perpendicular to the drawing surface, for example, 1000 switching elements arranged one-dimensionally, and these switching element arrays constitute a light bulb.

In the laser display device 200, the light emitted from the light sources 201a, 201b, and 201c of RGB enters into the light switching element arrays 202a, 202b, and 202c, respectively. It is preferable that the incident angle is nearly zero and the light enters perpendicularly for avoiding the influence of polarization. Reflected lights P from the light switching element arrays 202a, 202b, and 202c are condensed on the projection lens 204 by the dichroic mirrors 203a, 203b, and 203c, respectively. The light condensed on the projection lens 204 is scanned by the galvano-mirror 205, and projected on the projection screen 206 as two-dimensional image.

In such a laser display device 200, because the laser device 1 is used as the light source 201b, the second harmonics (green light) are generated with high efficiency and low power consumption, and the wavelength width may be widened in comparison with a laser light source of the related art. Therefore, speckle noise due to interference may be remarkably suppressed, and more distinct image may be generated.

In addition, the above-mentioned laser device 1 is not limitedly used as the green light source 201b. The laser device 1 may be used as a light source of other colors by appropriately setting the wavelength of the fundamental waves and the wavelengths of the harmonics.

Figure 8:
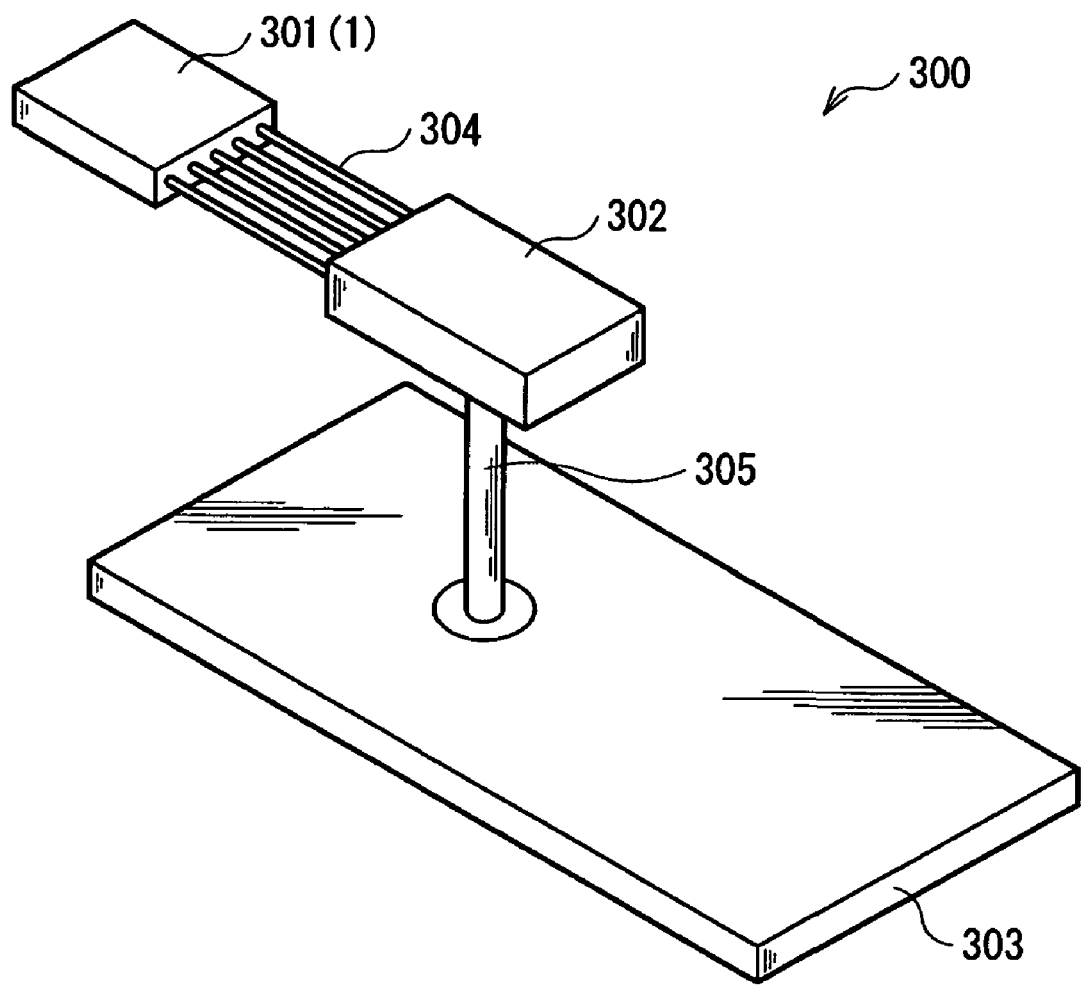
FIG. 8 is a configuration view of a laser processing device.

FIG. 8 illustrates an example of a laser irradiation device where the laser device 1 is applied to a light source of a laser processing device. In a laser processing device 300, a plurality of laser lights 304 (harmonics) emitted from a light source 301 are synthesized and shaped by a beam synthesis and formation system 302, and the wavelength width is widened. The synthesized light having the wide wavelength width is irradiated to an object to be processed 303, thereby the process such as surface modification is performed. In addition to the process described above, the laser irradiation device is also applicable to various inspections or the like.

Hereinbefore, the present invention is described with the embodiments. However, the present invention is not limited to those embodiments, and various modifications are possible. For example, although the case where the semiconductor laser array is used as the laser diode 10 is shown, a plurality of semiconductor laser chips with one or more luminous points are also may be used. Moreover, in the foregoing embodiment, although the case where a plurality of luminous points 10a are arranged in a single row in the width direction is shown, the luminous points 10a may be arranged in two rows or more, and may be surface-emitted.

In the foregoing embodiments, although the case where the plurality of fundamental waves change step by step in the width direction and all the wavelengths of the fundamental waves are different from one another is shown, the wavelengths of the fundamental waves may be partially the same and, in this case, wavelengths of at least two fundamental waves are different from each other. Moreover, the wavelengths of the fundamental waves are not limited to approximately 1060 nm, and any wavelengths are acceptable as long as the wavelengths may be generated by the laser diode. For example, the wavelengths of the fundamental waves may be used for blue light generation by the second harmonic generation of the laser diode oscillating with a wavelength band of 900 nm, and for ultraviolet light generation by the second harmonic generation of the laser diode oscillating with a wavelength band from 800 nm to 600 nm. Moreover, although the second harmonics generated in the nonlinear optical element 12 are used, the wavelength conversion of the second harmonics is further performed and the light with shorter wavelengths may be used. Various modifications are available, and it is also applicable to the case of a nonlinear wavelength conversion except the second harmonics such as generation of sum frequency and difference frequency.

The present application contains subject matter related to that disclosed in Japanese Priority Patent Application JP 2008-104916 filed in the Japanese Patent Office on Apr. 14, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A laser device comprising:
    a fundamental wave generating section that includes
        a laser diode having a plurality of luminous points linearly arranged in a width direction, and
        a bragg reflection structure having a periodic structure where reflection wavelengths change incrementally along the width direction; and
    a nonlinear optical element having a periodic polarization inversion structure, the nonlinear optical element generating harmonics corresponding to the fundamental waves, wherein
    the fundamental wave generating section generates a plurality of fundamental waves including at least two wavelengths different from each other,
    a period in polarization inversion of the nonlinear optical element changes incrementally along the width direction,
    a length of the periodic polarization inversion structure in the width direction is longer than a distance between end luminous points of the plurality of luminous points in the laser diode in the width direction.

2. The laser device according to claim 1, wherein a period in polarization inversion of the nonlinear optical element changes incrementally along the width direction.

3. The laser device according to claim 2, wherein the incremental change amount of the period in polarization inversion along the width direction satisfies quasi-phase matching conditions in a position where the plurality of fundamental waves enter the nonlinear optical element.

4. The laser device according to claim 1, wherein the bragg reflection structure is a grating disposed outside the laser diode, facing the laser diode, and the laser diode and bragg reflection structure forming a resonator structure.

5. The laser device according to claim 1, wherein the bragg reflection structure is a grating formed inside the laser diode.

6. The laser diode according to claim 5, wherein the laser diode is a distributed feed back laser having the grating adjacent to an active layer.

7. The laser device according to claim 5, wherein the laser diode is a distributed reflector laser having the grating in a light waveguide.

8. The laser device according to claim 3, wherein the nonlinear optical element generates a plurality of harmonics quasi-phase matched with the fundamental waves.

9. The laser device according to claim 1, further comprising:
    a filter disposed at a subsequent stage of the nonlinear optical element, and transmitting only the harmonics generated in the nonlinear optical element.

10. A laser display device comprising:
    the laser device according to claim 1 as a light source, and a filter transmitting the harmonics generated in the nonlinear optical element.

11. The laser display device according to claim 10, wherein the laser device outputs a laser light in a green wavelength region.

12. A laser irradiation device comprising:
    the laser device according to claim 1 as a light source.

13. The laser device according to claim 1, wherein a period of a grating of the periodic structure increases or decreases step by step along the width direction.

14. The laser device according to claim 1, wherein the reflection wavelengths of the bragg reflection structure change incrementally by increasing or decreasing step by step along the width direction.

15. The laser device according to claim 2, wherein the period in polarization inversion of the nonlinear optical element changes incrementally along the width direction by increasing or decreasing step by step along the width direction.

16. The laser device according to claim 14, wherein
    the reflection wavelengths of the bragg reflection structure change incrementally by increasing or decreasing step by step along the width direction,
    the incremental change amount of the period in polarization inversion along the width direction satisfies quasi-phase matching conditions in a position where the plurality of fundamental waves enter the nonlinear optical element, and
    a change ratio of reflection wavelengths of the bragg reflection structure along the width direction corresponds to a change ratio a change ratio of the period in polarization inversion.

17. The laser device according to claim 1, wherein the period in polarization inversion of the nonlinear optical element is generated by applying a voltage to the nonlinear optical element.

18. The laser device according to claim 1, wherein the nonlinear optical element is configured to be adjusted in the width direction relative to the laser diode.

19. The laser device according to claim 1, wherein the nonlinear optical element is formed with $LiTaO_3$.

20. The laser device according to claim 1, wherein the nonlinear optical element is formed with $LiNbO_3$.

* * * * *